United States Patent
Yoneda

(10) Patent No.: US 12,069,400 B2
(45) Date of Patent: Aug. 20, 2024

(54) SENSOR MODULE

(71) Applicant: Mitsubishi Electric Corporation, Tokyo (JP)

(72) Inventor: Yutaka Yoneda, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 780 days.

(21) Appl. No.: 17/258,087

(22) PCT Filed: Nov. 22, 2018

(86) PCT No.: PCT/JP2018/043133
§ 371 (c)(1),
(2) Date: Jan. 5, 2021

(87) PCT Pub. No.: WO2020/105162
PCT Pub. Date: May 28, 2020

(65) Prior Publication Data
US 2021/0289148 A1    Sep. 16, 2021

(51) Int. Cl.
*H01L 27/146* (2006.01)
*H04N 5/33* (2023.01)

(52) U.S. Cl.
CPC ......... *H04N 5/33* (2013.01); *H01L 27/14618* (2013.01)

(58) Field of Classification Search
None
See application file for complete search history.

(56) References Cited

U.S. PATENT DOCUMENTS

2007/0158538 A1* 7/2007 Wang ............... H01L 27/14625
250/239
2010/0065929 A1   3/2010 Okada et al.
(Continued)

FOREIGN PATENT DOCUMENTS

| JP | 2005-347397 A | 12/2005 |
| JP | 2006-086672 A | 3/2006 |
| JP | 2006-154319 A | 6/2006 |

(Continued)

OTHER PUBLICATIONS

An Office Action; "Notice of Reasons for Refusal," mailed by the Japanese Patent Office on Mar. 29, 2022, which corresponds to Japanese Patent Application No. 2020-557096 is related to U.S. Appl. No. 17/258,087 with English language translation.
(Continued)

*Primary Examiner* — Ali Naraghi
*Assistant Examiner* — E. Rhett Cheek
(74) *Attorney, Agent, or Firm* — Studebaker & Brackett PC

(57) ABSTRACT

A sensor module comprising:
A sensor chip (5) is provided on an upper surface of the substrate (1). A lens (7) is provided above the sensor chip (5) such that a light receiving unit of the sensor chip (5) is positioned in a projection area. A lens cap (8) includes a cap body (8a) surrounding the sensor chip (5) to hold the lens (7), and a cap edge part (8b) protruding outward from a lower end part of the cap body (8a). An ultraviolet-curing type bonding agent (9) bonds the upper surface of the substrate (1) and a lower surface of the lens cap (8). A cutout (10) is provided on an outer side surface of the cap edge part (8b). The bonding agent (9) enters in the cutout (10).

4 Claims, 9 Drawing Sheets

(56) References Cited

U.S. PATENT DOCUMENTS

2016/0306265 A1* 10/2016 Riel ..................... G02B 7/003
2018/0286902 A1* 10/2018 Hokari ................. H01L 27/14

FOREIGN PATENT DOCUMENTS

| | | | |
|---|---|---|---|
| JP | 2006-203402 A | | 8/2006 |
| JP | 2011-220939 A | | 11/2011 |
| KR | 100836133 B1 | * | 2/2007 |
| WO | 2008/023827 A1 | | 2/2008 |

OTHER PUBLICATIONS

International Search Report; Written Opinion; and Notification of Transmittal of the International Search Report and the Written Opinion of the International Searching Authority, or the Declaration issued in PCT/JP2018/043133; mailed Feb. 12, 2019.

An Office Action mailed by China National Intellectual Property Administration on Dec. 1, 2023, which corresponds to Chinese Patent Application No. 201880098931.6 and is related to U.S. Appl. No. 17/258,087; with English language translation.

An Office Action mailed by China National Intellectual Property Administration on Mar. 23, 2024, which corresponds to Chinese Patent Application No. 201880098931.6 and is related to U.S. Appl. No. 17/258,087; with English language translation.

* cited by examiner

SENSOR MODULE

FIELD

The present disclosure relates to a sensor module.

BACKGROUND

In a sensor module such as an infrared sensor, a lens is provided above a sensor chip such that a light receiving unit of the sensor chip is positioned in a projection area, and a lens cap surrounds the sensor chip to hold the lens. The lens cap is positioned on an upper surface of an insulation substrate on which the sensor chip is provided, and fixed by a bonding agent.

Glass epoxy as a main material of the insulation substrate and thermoplastic plastic as a main material of the lens cap have linear expansion coefficients different from each other. Accordingly, stress is generated at a bonding part due to operation of the sensor module or change of surrounding temperature. This stress is repeatedly generated as the sensor module is used continuously, and thus, the bonding part potentially breaks or flakes due to fatigue.

Accordingly, the position of the lens cap changes and the relative positions of the light receiving unit of the sensor chip and the condensation point of the lens change, which causes such a risk that the infrared sensor cannot perform image capturing, deficiency occurs in an image, or focus is lost. To avoid this, a technology of forming a recess at a bonding surface of the lens cap to increase the bonding area of the bonding agent and the lens cap, thereby improving bonding strength has been proposed (refer to Patent Literature 1 (claim 1 and FIGS. 6 and 7), for example).

CITATION LIST

Patent Literature

[Patent Literature 1] JP 2005-347397 A

SUMMARY

Technical Problem

When the bonding area with the bonding agent is increased, breaking and flaking of the bonding agent after the bonding agent is cured can be prevented but positional shift and flaking of the lens cap due to vibration or impact in conveyance before the bonding agent is cured cannot be prevented. To prevent this, an ultraviolet-curing type bonding agent can be used. Specifically, the ultraviolet-curing type bonding agent is applied on the upper surface of the insulation substrate in advance, and then the lens cap is positioned and disposed. Subsequently, the bonding agent is irradiated with ultraviolet and temporarily cured. Lastly, the sensor module is put into an oven or the like and the entire sensor module is heated to permanently cure the bonding agent. However, a space in which the light source of ultraviolet is provided can be ensured only above the lens cap. Since the bonding agent is applied between the insulation substrate and the lens cap, the bonding agent cannot be irradiated with ultraviolet from above the lens cap, and thus it is difficult to cure the bonding agent.

In addition, since the bonding agent contracts at curing, the curing time and contraction amount of the bonding agent are different between places due to variance of heating temperature in the module or difference in the thickness of the bonding agent below the lens cap. Accordingly, positional shift of the lens cap occurs at curing and contraction of the bonding agent, which potentially slightly changes the relative positions of the light receiving unit of the sensor chip and the condensation point of the lens.

The present invention is made to solve the problem as described above and intended to provide a sensor module in which positional shift and flaking of a lens cap can be prevented.

Solution to Problem

A sensor module according to the present disclosure includes: a substrate; a sensor chip provided on an upper surface of the substrate; a lens provided above the sensor chip such that a light receiving unit of the sensor chip is positioned in a projection area; a lens cap including a cap body surrounding the sensor chip to hold the lens, and a cap edge part protruding outward from a lower end part of the cap body: and an ultraviolet-curing type bonding agent bonding the upper surface of the substrate and a lower surface of the lens cap, wherein a cutout is provided on an outer side surface of the cap edge part, and the bonding agent enters in the cutout.

Advantageous Effects of Invention

In the present disclosure, the cutout is provided at the outer side surface of the cap edge part of the lens cap, and the bonding agent enters the cutout. Accordingly, when the bonding agent is irradiated with ultraviolet from above the lens cap, the bonding agent can be temporarily cured in the same process as applying the bonding agent. Thus, it is possible to prevent positional shift and flaking of the lens cap due to vibration or impact in conveyance before main curing of the bonding agent. In addition, the bonding agent that has entered the cutout is first cured by ultraviolet irradiation to fix the lens cap. Thus, minute positional shift of the lens cap due to curing and contraction of the other bonding agent can be prevented.

DESCRIPTION OF EMBODIMENTS

Sensor modules according to embodiments will be described with reference to the drawings. Identical or corresponding components are denoted by an identical reference sign, and duplicate description thereof is omitted in some cases. The contents of the following description and drawings are not intended to limit subjects recited in the claims. The sizes or scales of corresponding components between the drawings are independent from each other. For example, the size or scale of an identical configuration part may be different between a drawing in which part of a configuration is changed and a drawing in which the part is not changed. Although an actual product includes a larger number of members, only a part necessary for description is recited and description of the other parts is omitted for simplification of description.

Embodiment 1

Figure 1:
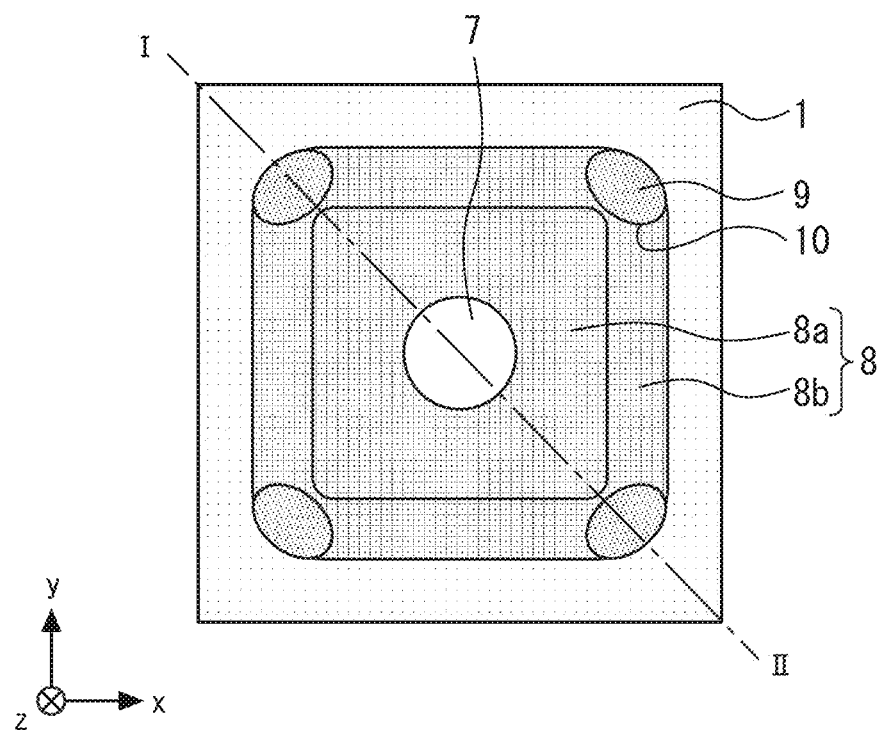
FIG. 1 is a plan view illustrating a sensor module according to Embodiment 1.
Figure 2:
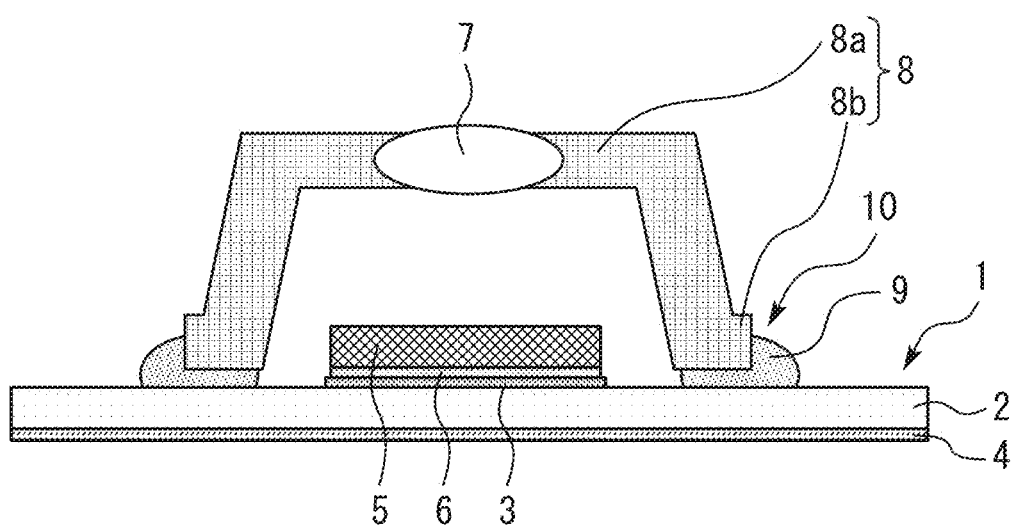
FIG. 2 is a cross-sectional view taken along line I-II in FIG. 1.

FIG. 1 is a plan view illustrating a sensor module according to Embodiment 1. FIG. 2 is a cross-sectional view taken along line I-II in FIG. 1. The sensor module is an infrared sensor in the present embodiment, but is not limited thereto and may be another sensor module such as a camera having the same problem.

A substrate 1 is a substrate that includes a circuit having various kinds of functions and in which electrode patterns 3 and 4 are provided on facing upper and lower surfaces, respectively, of a glass epoxy base material 2 as an electrical insulation object. A sensor chip 5 is provided on an upper surface of the substrate 1. A lower surface of the sensor chip 5 is bonded to the electrode pattern 3 by Ag paste 6. The drawing illustrates only a basic configuration part of the infrared sensor and omits illustration of any other electronic device joined to the substrate 1, such as a dedicated IC, a wire, a capacitor, or a connector.

Typically, the same material is used for the electrode patterns 3 and 4. The electrode pattern 3 electrically connects the sensor chip 5 with another electronic device by forming a joining part with an Au wire or the like. The electrode patterns 3 and 4 are wiring members that electrically connect the sensor chip 5 with another electronic device and connect with another circuit board, an external power source, or the like, and thus are preferably made of a metal having a small electric resistance. The electrode patterns 3 and 4 are, for example, Cu foils of approximately 10 to 40 μm.

The sensor chip 5 is an image capturing device such as a thermal infrared sensor. For example, the sensor chip 5 is a resistance bolometer type sensor, of which a typical example is vanadium oxide (VOx), or an SOI diode bolometer type sensor utilizing temperature characteristics of a PN diode, and is made of Si. The number of sensor chips 5 is not limited to one.

When the sensor chip 5 is bonded by the Ag paste 6, other electronic components are already joined on the substrate 1 by soldering. Thus, the Ag paste 6 preferably has a curing temperature lower than the melting point of solder to prevent surrounding solder from melting again at bonding of the sensor chip 5. In addition, the Ag paste 6 preferably has a large thermal conductivity to avoid increase of the temperature of the sensor chip 5. Thus, the Ag paste 6 may be another conductive bonding agent or a sintered joining material such as Ag nano particle paste, but the Ag paste 6 is used from viewpoints of bonding temperature or thermal conductivity, cost, and the like.

A lens 7 that transmits and condenses infrared is provided above the sensor chip 5 such that a light receiving unit of the sensor chip 5 is positioned in a projection area. A lens cap 8 includes a cap body 8a surrounding the sensor chip 5 to hold the lens 7, and a cap edge part 8b protruding outward from a lower end part of the cap body 8a. The lens cap 8 is made of thermoplastic resin, thermosetting resin, metal, or the like. The cap body 8a is a box including an upper surface part that has a flat plate shape and to which the lens 7 is integrally fixed, and a side part continuous with an outer edge of the upper surface part. The shape of the upper surface part is square but may be rectangular, circular, elliptical, or the like.

An ultraviolet-curing type bonding agent 9 bonds the upper surface of the substrate 1 and a lower surface of the lens cap 8. The lens cap 8 is bonded to the substrate 1 by the bonding agent 9 at a position where infrared having transmitted through the lens 7 condenses to the light receiving unit of the sensor chip 5. Since the cap edge part 8b protruding outward from the lower end part of the cap body 8a is provided, the bonding area with the substrate 1 is increased to have increased bonding strength.

The thickness of the glass epoxy base material 2 is set to be large at approximately 0.8 mm to 1.0 mm so that deformation such as warping is unlikely to occur at driving due to linear-expansion-coefficient difference from the lens cap 8, the sensor chip 5, or another electronic device. A plurality of sensor chips 5 may be provided on one substrate 1. Alternatively, a plurality of electrode patterns 3 and 4 may be provided on one substrate 1, one sensor chip 5 and another electronic device may be bonded to each of the electrode patterns 3 and 4, each sensor chip 5 may be sealed by the lens cap 8, and the substrate 1 may be cut and divided into the individual sensor chips 5.

The lens 7 is a silicon lens having convex spherical surfaces on both sides, has an outer periphery integrally covered by the lens cap 8, and accordingly, is fixed to the upper surface part of the lens cap 8. Thus, as the lens cap 8 moves, the lens 7 moves and the relative positions of the sensor chip 5 and the lens 7 change. The lens 7 transmits infrared but does not transmit visible light, and thus the inside of the lens cap 8 cannot be observed through the lens 7.

The lens cap 8 is assembled such that the condensation point of the lens 7 overlaps the light receiving unit of the sensor chip 5 to allow the sensor chip 5 to correctly perform image capturing. However, at assembly of the lens cap 8, various members such as the sensor chip 5 are joined or bonded to the surface of the substrate 1 by soldering, a conductive bonding agent, or the like. In addition, since the lens cap 8 is shaped of thermoplastic resin, soldering and the like cannot be used to assemble the lens cap 8, and the bonding agent 9 that can be bonded by heating at relatively low temperature or by other means needs to be used. Such a bonding agent 9 takes time until bonding is completed unlike soldering. Thus, when application of the bonding agent 9 onto the upper surface of the substrate 1, mounting of the lens cap 8, and curing of the bonding agent 9 to complete bonding are performed in the same device, the process of curing the bonding agent 9 to complete bonding is a bottleneck and efficiency is extremely low. To avoid this, a device that performs the application of the bonding agent 9 up to the mounting of the lens cap 8, and a device that cures the bonding agent 9 to complete bonding are separately provided for different processes, and the number of products simultaneously input to the device that cures the bonding agent 9 is increased. It is typical that a time taken for curing the bonding agent 9 for each product is reduced in this manner. To achieve this, the product needs to be conveyed from a device to another device while the lens cap 8 is mounted on the bonding agent 9 applied to the surface of the substrate 1 but yet to be cured.

In conveyance work before curing of the bonding agent 9, when vibration or impact occurs to the sensor module for a reason such as falling of the product, abrupt movement of the product, or contact of a conveyance table or a jig with another device, the position of the lens cap 8 changes due to deformation of the bonding agent 9, flaking of the lens cap 8, or the like, which potentially changes the relative positions of the light receiving unit of the sensor chip 5 and the condensation point of the lens 7. This causes such a risk that the sensor chip 5 cannot perform image capturing, deficiency occurs in an image even with minute displacement, or focus is lost, or the like.

When the lens cap 8 and the lens 7 are separated, it is possible to readjust the position of the lens 7 so that the condensation point of the lens 7 overlaps the light receiving unit of the sensor chip 5 after curing of the bonding agent 9. However, the lens cap 8 and the lens 7 are integrally shaped to reduce the number of components for cost reduction. In this case, the position of the lens 7 cannot be readjusted after the lens cap 8 is placed on the bonding agent 9. Thus, to prevent positional shift and flaking of the lens cap 8 due to vibration or impact in conveyance, the bonding agent 9 is irradiated with ultraviolet and temporarily cured in the same device that mounts the lens cap 8 on the bonding agent 9.

At assembly of a plurality of infrared sensors from one substrate 1, when a light source of ultraviolet is positioned on a side-surface side of the substrate 1 (X-Y axis direction), ultraviolet is interrupted by the surrounding lens cap 8 and the ultraviolet does not reach the bonding agent 9 applied at the center of the substrate 1. Thus, the light source of ultraviolet is positioned above the lens cap 8 (positive Z-axis direction).

In the present embodiment, arc-shaped cutouts 10 are provided on an outer side surface of the cap edge part 8b at the four corners of the square cap edge part 8b. The bonding agent 9 applied on the entire circumference between the lower surface of the lens cap 8, which is a bonding surface including the cap edge part 8b, and the upper surface of the substrate 1 is pressurized by the lens cap 8 and protrudes out of the lens cap 8. The protruding bonding agent 9 enters the cutouts 10 and forms fillets. When the bonding agent 9 is irradiated with ultraviolet from above the lens cap 8, the ultraviolet reliably reaches the bonding agent 9 having entered the cutouts 10, and thus at least the bonding agent 9 having entered the cutouts 10 can be cured. Accordingly, the lens cap 8 can be reliably bonded at the four corners of the lens cap 8. Thereafter, the bonding agent 9 is mainly cured by heating or the like.

When the lens cap 8 is bonded by the bonding agent 9, the sensor chip 5 is bonded to the surface of the substrate 1 by the Ag paste 6, and another electronic component is joined by soldering. Thus, to prevent these components from breaking and solder from being melted again at main curing of the bonding agent 9, the curing temperature of the bonding agent 9 is preferably lower than the heat-resistant temperatures of these components and the melting point of solder. The bonding agent 9 is an ultraviolet-curing bonding agent or an ultraviolet thermosetting bonding agent that is cured with ultraviolet and by heating. Heating temperature for curing the bonding agent 9 can be set to be high when thermoplastic resin having high thermal resistance, such as polycarbonate (PC), nylon 66 (PA66), polybutylene terephthalate (PBT), or poly phenylene sulfide (PPS) is used as the material of the lens cap 8.

As described above, in the present embodiment, the cutouts 10 are provided at the outer side surface of the cap edge part 8b of the lens cap 8, and the bonding agent 9 enters the cutouts 10. Accordingly, when the bonding agent 9 is irradiated with ultraviolet from above the lens cap 8, the ultraviolet reliably reaches the bonding agent 9 having entered the cutouts 10, and thus at least the bonding agent 9 having entered the cutouts 10 can be temporarily cured. Thus, it is possible to prevent positional shift and flaking of the lens cap 8 due to vibration or impact in conveyance before main curing of the bonding agent 9. Moreover, since the bonding agent 9 having entered the cutouts 10 is temporarily cured to fix the lens cap 8, minute positional shift of the lens cap 8 due to curing and contraction of the other bonding agent 9 can be prevented when the bonding agent 9 is mainly cured by heating or the like.

The bonding area increases because the length of a side surface of the cap edge part 8b of the lens cap 8 increases by an amount corresponding to the cutouts 10. In addition, physical deformation due to stress generated at the bonding part in a shear direction (X-Y axis direction) can be prevented by the bonding agent 9 having entered the cutouts 10 at the outer side surface of the cap edge part 8b. Accordingly, the substrate 1 and the lens cap 8 can be solidly bonded to each other, and thus it is possible to prevent breaking or flaking of the bonding part due to fatigue. As a result, it is possible to obtain an infrared sensor having a high quality and a long lifetime.

A breakdown test in which a conventional lens cap and the lens cap 8 provided with the cutouts 10 at the four corners were each bonded by the bonding agent 9 under the same condition and a load was applied from a side surface of the lens cap 8 in the shear direction was actually performed three times each. As a result, as indicated in Table 1, a breakdown load of the conventional lens cap was 7.9 kgf on average, but a breakdown load of the lens cap 8 provided with the cutouts 10 was 18.8 kgf on average, which is two or more times larger than the conventional lens cap.

TABLE 1

| | share strength [kgf] | |
|---|---|---|
| | conventional lens cap | lens cap provided with cutouts |
| No.1 | 7.2 | 24.1 |
| No.2 | 8.2 | 17.6 |
| No.3 | 8.4 | 14.8 |
| average | 7.9 | 18.8 |

The cutouts 10 may be formed in any number and in any shape at any part of the outer side surface of the cap edge part 8b of the lens cap 8. However, the positions and shapes of the cutouts 10 need to be set to prevent movement of the lens cap 8 in the X-Y axis direction and a rotational direction when the bonding agent 9 having entered the cutouts 10 is cured.

Figure 3:
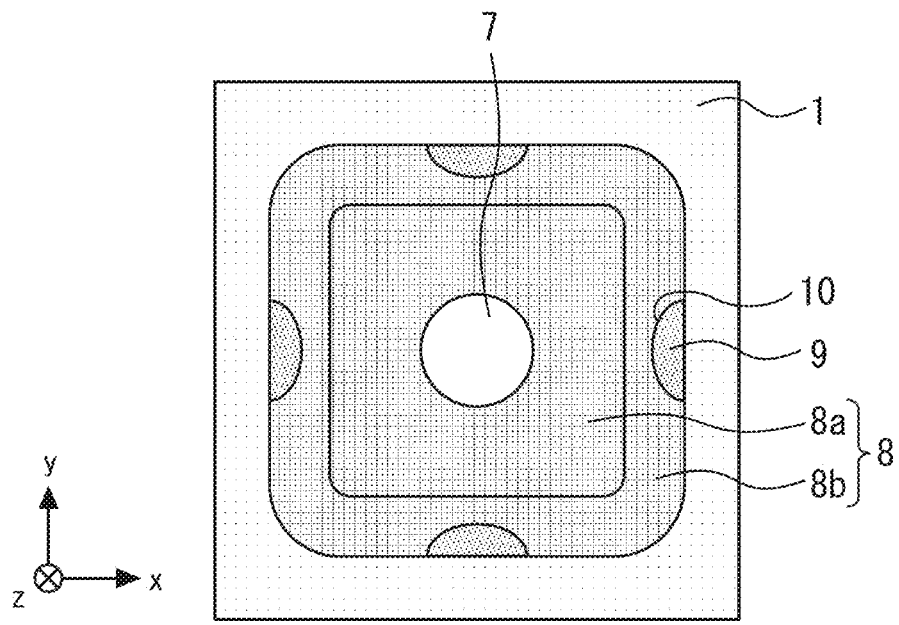
FIG. 3 is a plan view illustrating Modification 1 of the sensor module according to Embodiment 1.
Figure 4:
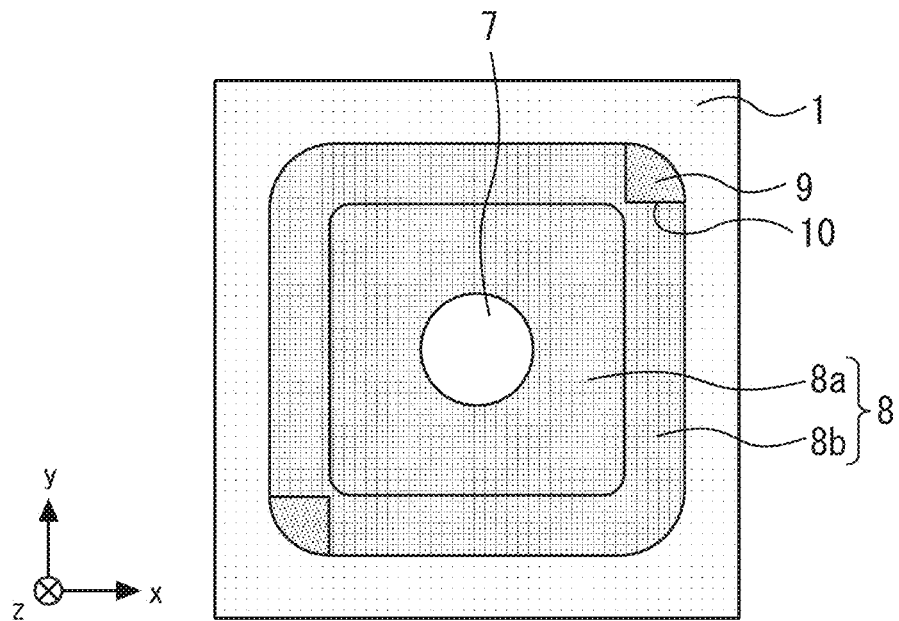
FIG. 4 is a plan view illustrating Modification 2 of the sensor module according to Embodiment 1.
Figure 5:
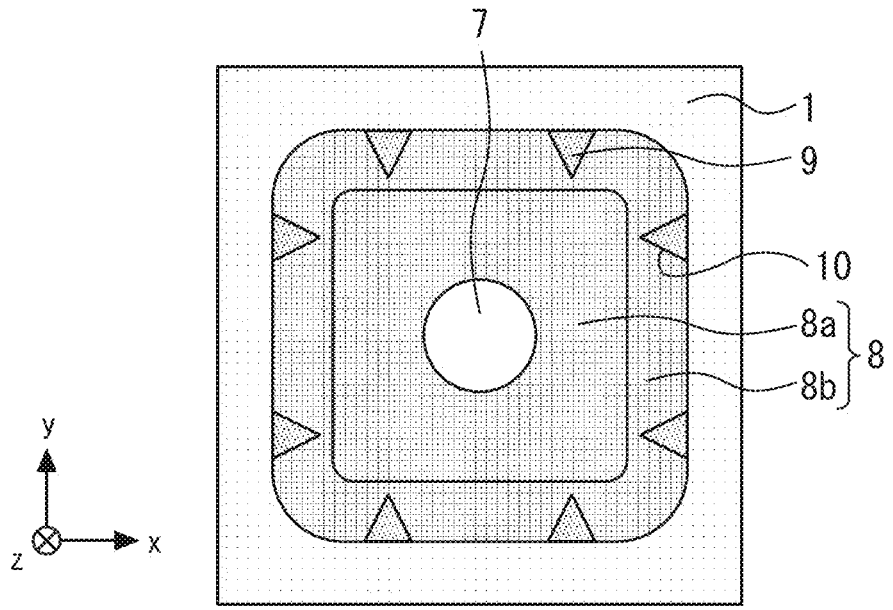
FIG. 5 is a plan view illustrating Modification 3 of the sensor module according to Embodiment 1.
Figure 6:
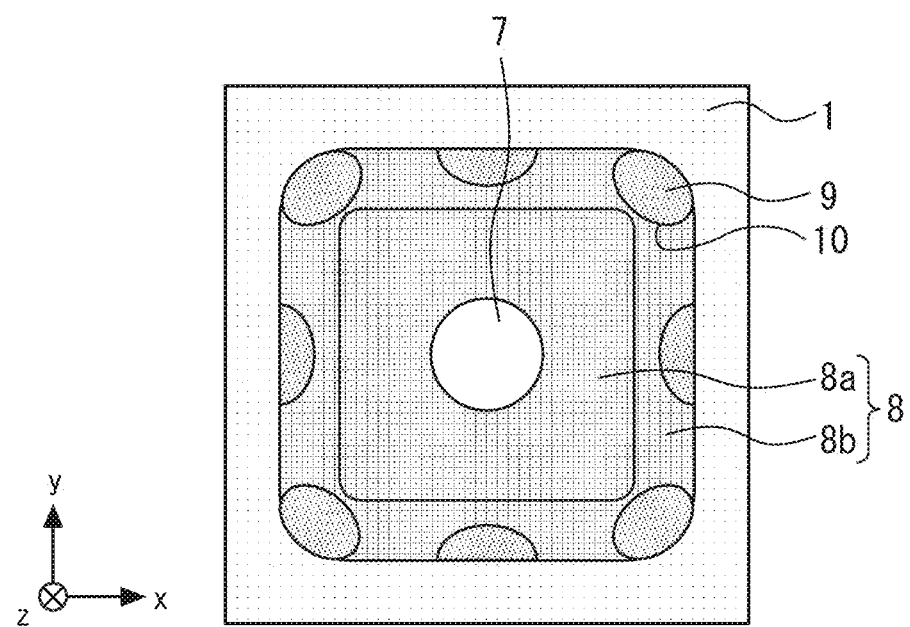
FIG. 6 is a plan view illustrating Modification 4 of the sensor module according to Embodiment 1.

FIG. 3 is a plan view illustrating Modification 1 of the sensor module according to Embodiment 1. A circular cutout 10 is provided at the center of each side of the lens cap 8, which is closest to the lens 7, so that an optical center position of the lens 7 does not move. Accordingly, the length of the side surface of the cap edge part Sb increases by an amount corresponding to the cutouts 10, and can thereby increase the bonding area. FIG. 4 is a plan view illustrating Modification 2 of the sensor module according to Embodiment 1. The quadrilateral cutouts 10 are provided at two opposing corner parts of the lens cap 8. FIG. 5 is a plan view illustrating Modification 3 of the sensor module according to Embodiment 1. Triangular cutouts 10 are provided at two places each on each side of the lens cap 8. FIG. 6 is a plan view illustrating Modification 4 of the sensor module according to Embodiment 1. Cutouts 10 are provided at the four corners of the lens cap 8 and a central part of each side thereof, which is closest to the lens 7, where stress is most generated on the bonding agent 9.

Embodiment 2

Figure 7:
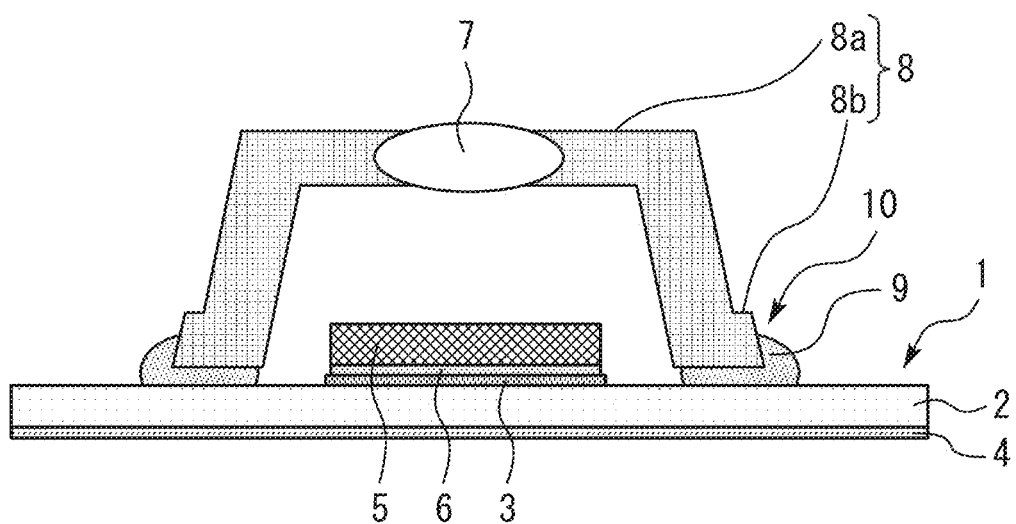
FIG. 7 is a cross-sectional view illustrating a sensor module according to Embodiment 2.

FIG. 7 is a cross-sectional view illustrating a sensor module according to Embodiment 2. A plan view thereof is same as FIG. 1, and FIG. 7 corresponds to a cross-sectional view taken along line I-II in FIG. 1. An inner surface of each cutout 10 has a taper shape that is tilted toward the inside of the lens cap 8 from a lower surface of the cap edge part 8b to an upper surface thereof. Accordingly, the bonding agent 9 having entered the cutout 10 is more likely to be irradiated with ultraviolet. In addition, displacement of the lens cap 8 in the X-Y direction and the rotational direction as well as displacement in the Z direction can be prevented when the bonding agent 9 having entered the cutout 10 is cured. Other configurations and effects are same as those of Embodiment 1.

Embodiment 3

Figure 8:
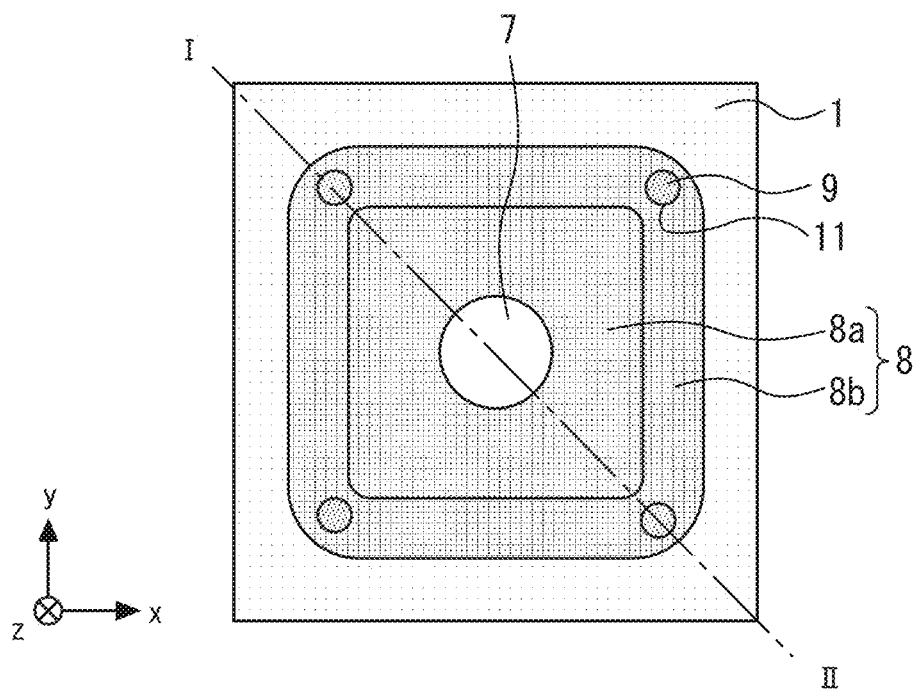
FIG. 8 is a plan view illustrating a sensor module according to Embodiment 3.
Figure 9:
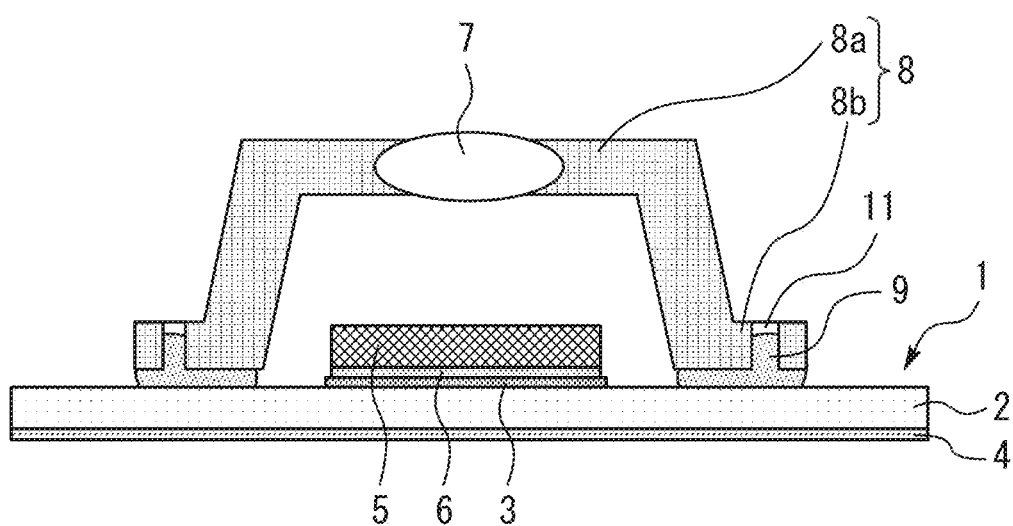
FIG. 9 is a cross-sectional view taken along line I-II in FIG. 8.

FIG. 8 is a plan view illustrating a sensor module according to Embodiment 3. FIG. 9 is a cross-sectional view taken along line I-II in FIG. 8. In the present embodiment, circular first through-holes 11 penetrating from the upper surface of the cap edge part 8b to the lower surface thereof are provided at the four corners of the cap edge part 8b, respectively, in place of the cutouts 10 of Embodiment 1. The bonding agent 9 applied between the lower surface of the lens cap 8 and the upper surface of the substrate 1 is pressurized by the lens cap 8, and part of the deformed bonding agent 9 enters in the first through-holes 11.

When the bonding agent 9 is irradiated with ultraviolet from above the lens cap 8, the ultraviolet reliably reaches the bonding agent 9 having entered the first through-holes 11, and thus at least the bonding agent 9 having entered the first through-holes 11 can be temporarily cured. Accordingly, effects same as those of Embodiment 1 can be obtained. In addition, the bonding agent 9 wetly spreads on an inner wall of each first through-hole 11, and thus the bonding area can be increased as compared to that of the cutouts 10.

The first through-holes 11 may be formed in any number and in any shape at any part of the cap edge part 8b of the lens cap 8. However, the positions and shapes of the first through-holes 11 need to be set to prevent movement of the lens cap 8 in the X-Y axis direction and the rotational direction when the bonding agent 9 having entered the first through-holes 11 is cured. Unlike the cutouts 10, even one first through-hole 11 can prevent movement in the X-Y axis direction and the rotational direction, depending on its shape. Thus, the shapes and number of the first through-holes 11 can be determined more freely in comparison to the cutouts 10.

Figure 10:
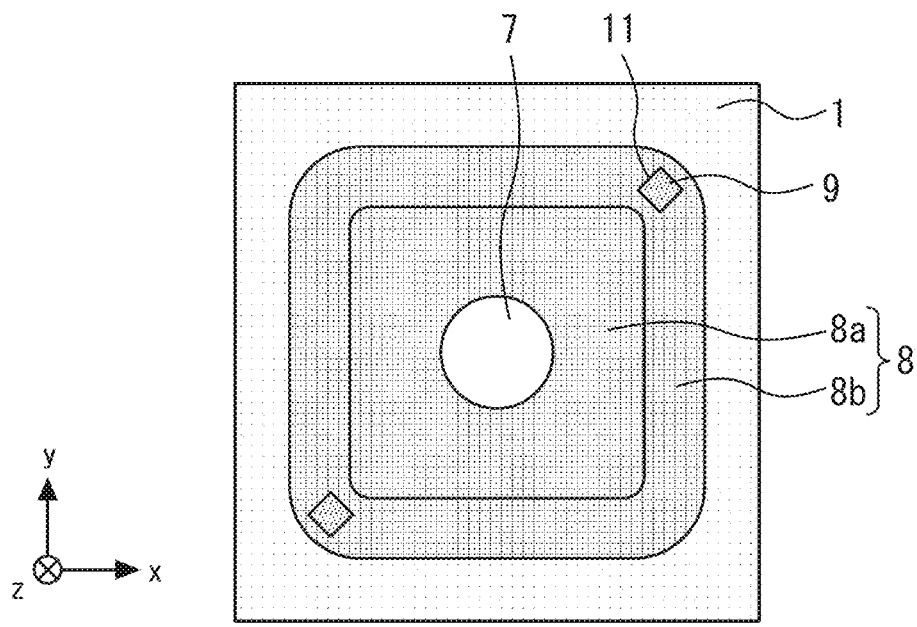
FIG. 10 is a plan view illustrating Modification 1 of the sensor module according to Embodiment 3.
Figure 11:
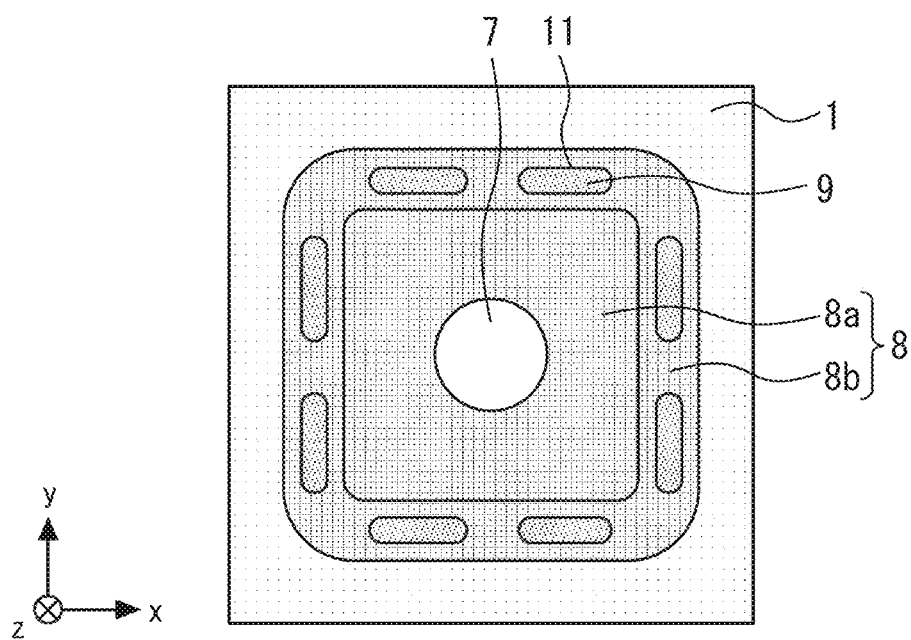
FIG. 11 is a plan view illustrating Modification 2 of the sensor module according to Embodiment 3.
Figure 12:
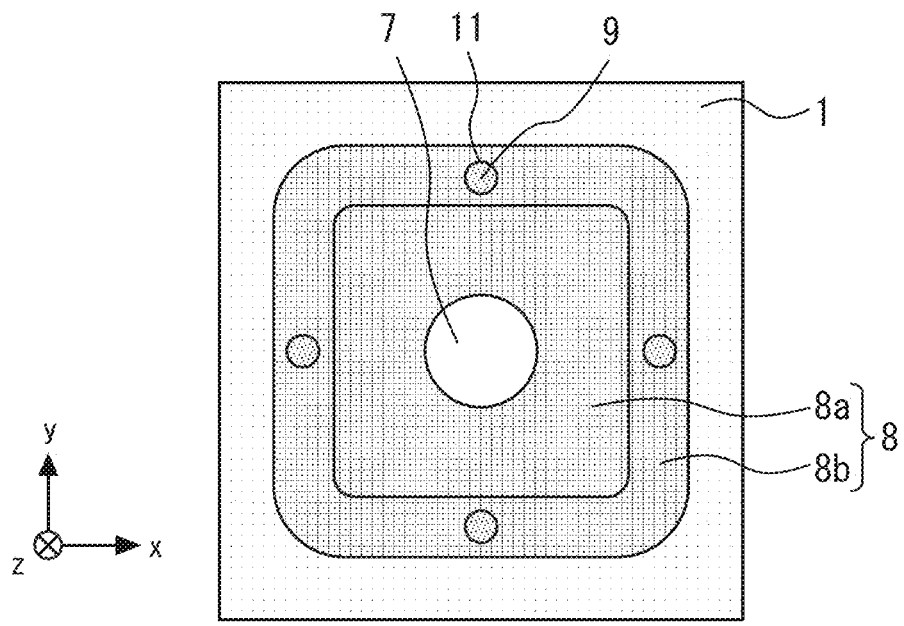
FIG. 12 is a plan view illustrating Modification 3 of the sensor module according to Embodiment 3.
Figure 13:
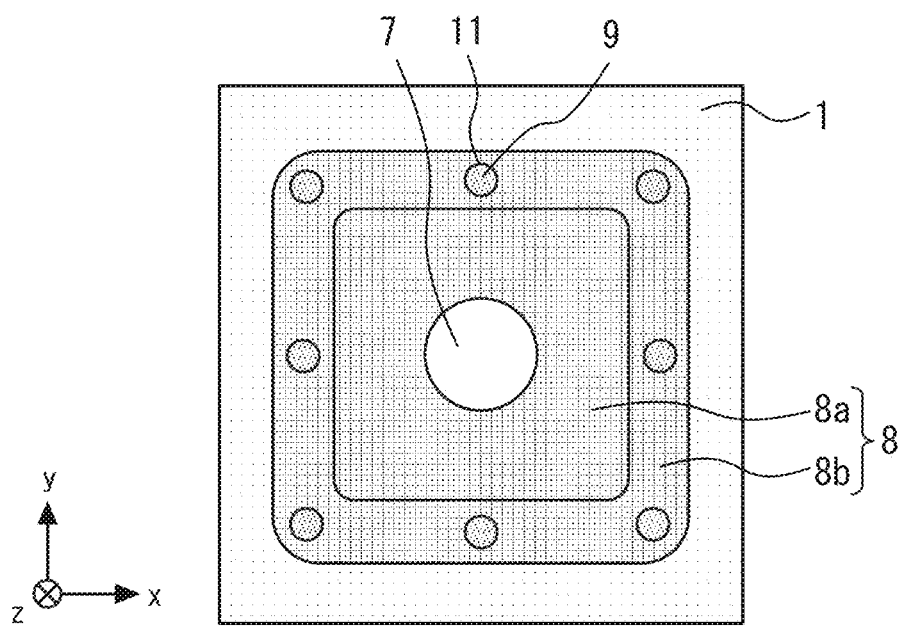
FIG. 13 is a plan view illustrating Modification 4 of the sensor module according to Embodiment 3.

FIG. 10 is a plan view illustrating Modification 1 of the sensor module according to Embodiment 3. Quadrilateral first through-holes 11 are provided at two opposing corner parts of the lens cap 8. FIG. 11 is a plan view illustrating Modification 2 of the sensor module according to Embodiment 3. Elongated first through-holes 11 are provided at two places each on each side of the lens cap 8. FIG. 12 is a plan view illustrating Modification 3 of the sensor module according to Embodiment 3. A first through-hole 11 is provided at a central part of each side, which is closest to the lens 7, so that the optical center position of the lens 7 does not move. FIG. 13 is a plan view illustrating Modification 4 of the sensor module according to Embodiment 3. First through-holes 11 are provided at both the four corners of the lens cap 8 and a central part of each side thereof, which is closest to the lens 7, where stress is most generated at the bonding agent 9.

Embodiment 4

Figure 14:
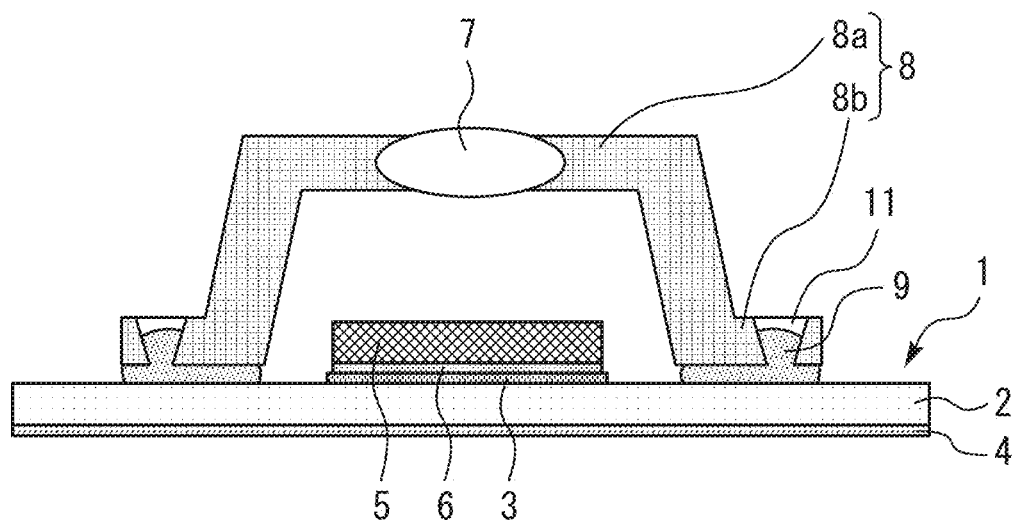
FIG. 14 is a cross-sectional view illustrating a sensor module according to Embodiment 4.

FIG. 14 is a cross-sectional view illustrating a sensor module according to Embodiment 4. A plan view thereof is same as FIG. 8, and FIG. 14 corresponds to a cross-sectional view taken along line I-II in FIG. 8. The opening area of each first through-hole 11 at the upper surface of the cap edge part 8b is larger than the opening area of the first through-hole 11 at the lower surface of the cap edge part 8b. Accordingly, the bonding agent 9 having entered the first through-holes 11 of the lens cap 8 is more likely to be irradiated with ultraviolet. In addition, displacement of the lens cap 8 in the X-Y axis direction and the rotational direction as well as displacement in the Z direction can be prevented when the bonding agent 9 having entered the first through-holes 11 is cured. Other configurations and effects are same as those of Embodiment 3.

Embodiment 5

Figure 15:
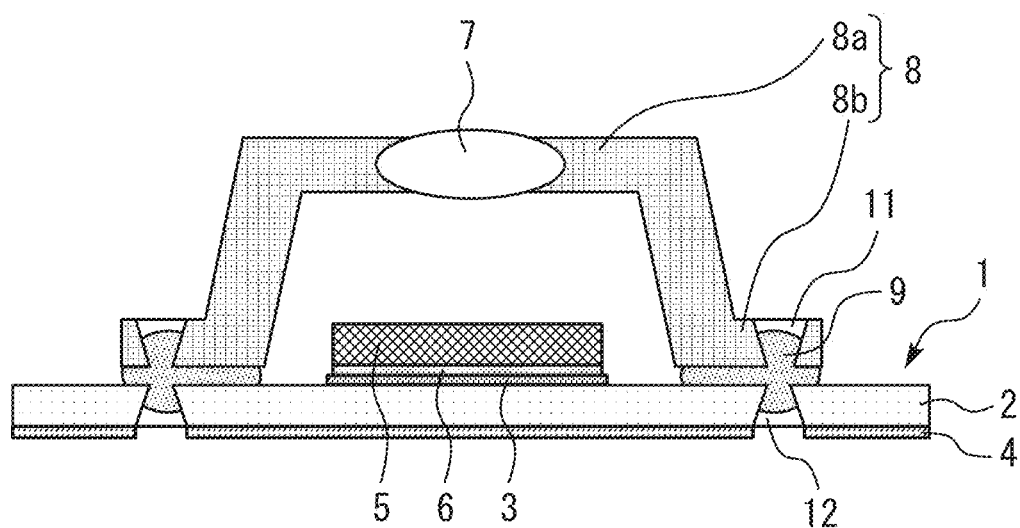
FIG. 15 is a cross-sectional view illustrating a sensor module according to Embodiment 5.

FIG. 15 is a cross-sectional view illustrating a sensor module according to Embodiment 5. Second through-holes 12 are provided on the substrate 1 at positions facing circular first through-holes 11 provided at the four corners of the cap edge part 8b. The bonding agent 9 enters not only the first through-holes 11 of the lens cap 8 but also the second through-holes 12 of the substrate 1. Accordingly, the substrate 1 is fixed by the cured bonding agent 9 as well, and the bonding area on the substrate 1 side can be increased. Thus, not only the position of the lens cap 8 but also the position of the substrate 1 can be prevented from changing due to falling of the product, abrupt movement, contact of the conveyance table or a jig with another device, curing and contraction of the bonding agent 9, or the like in conveyance work. In addition, the bonding part can be prevented from breaking or flaking due to fatigue. The second through-holes 12 may be formed in any number and in any shape if at positions facing the first through-holes 11.

The opening area of each second through-hole 12 at the upper surface of the substrate 1 as the bonding surface is smaller than the opening area of each second through-hole 12 at the lower surface of the substrate 1. Not only displacement of the substrate 1 in the X-Y axis direction and the rotational direction but also displacement in the Z direction can be prevented when the bonding agent 9 having entered the second through-holes 12 is cured by ultraviolet. Other configurations and effects are same as those of Embodiment 4.

Embodiment 6

Figure 16:
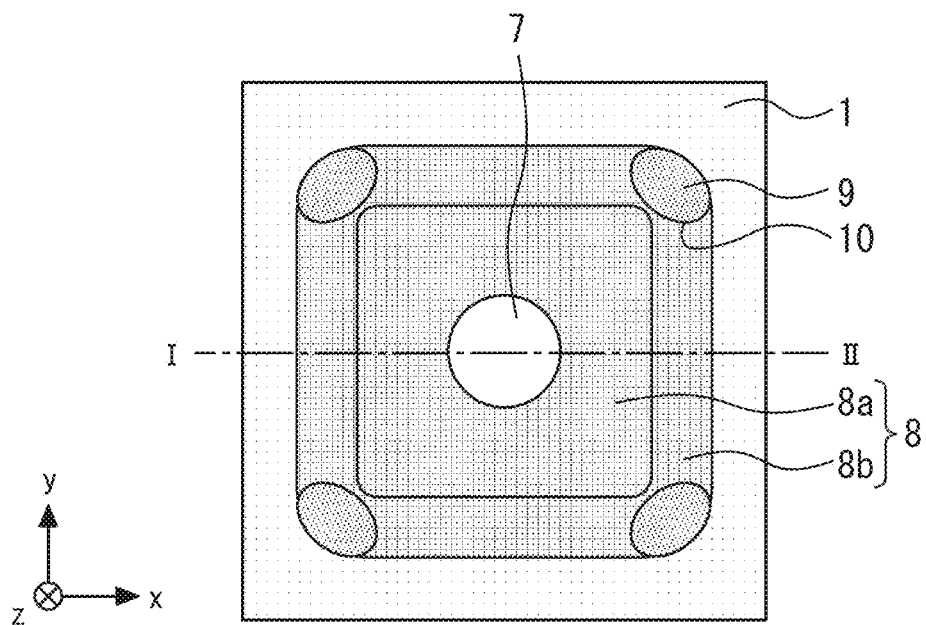
FIG. 16 is a plan view illustrating a sensor module according to Embodiment 6.
Figure 17:
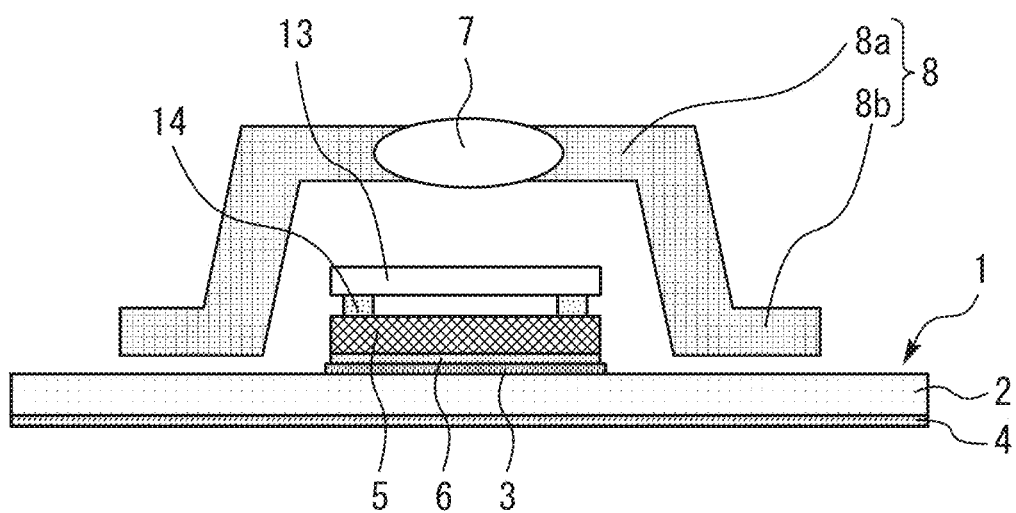
FIG. 17 is a cross-sectional view taken along line I-II in FIG. 16.

FIG. 16 is a plan view illustrating a sensor module according to Embodiment 6. FIG. 17 is a cross-sectional view taken along line I-II in FIG. 16. In Embodiment 1, the bonding agent 9 is applied to the entire lower surface of the lens cap 8, and the sensor chip 5 is vacuum-sealed by the lens cap 8 and the bonding agent 9. However, in the present embodiment, a case 13 that vacuum-seals the light receiving unit of the sensor chip 5 is provided inside the lens cap.

The case 13 is a plane silicon plate, and Au metalization is provided on an outer periphery of a surface facing the sensor chip 5. The case 13 is joined to the sensor chip 5 by solder 14 on an outer periphery of the light receiving unit of the sensor chip 5. The case 13 may be made of any material capable of transmitting infrared, but is preferably made of a material same as that of the lens 7.

Since the case 13 is provided, the inside of the lens cap 8 does not need to be vacuum-sealed. Thus, the bonding agent 9 only needs to be applied enough that the bonding part does not break nor flake due to fatigue. For example, the bonding agent 9 is applied only to arc-shaped cutouts 10 provided at the four corners of the cap edge part 8b. The bonding area of the bonding agent 9 decreases as compared to a case in which the bonding agent 9 is applied to the entire lower surface of the lens cap 8, and thus the present disclosure that locally improves the bonding strength of the bonding agent 9 is effective, in particular. Other configurations and effects are same as those of Embodiments 1 to 5.

REFERENCE SIGNS LIST

1 substrate, 5 sensor chip, 7 lens, 8 lens cap, 8a cap body, 8b cap edge part, 9 bonding agent, 10 cutout, 11 first through-hole, 12 second through-hole, 13 case

The invention claimed is:

1. A sensor module comprising:
a substrate;
a sensor chip provided on an upper surface of the substrate;
a lens provided above the sensor chip such that a light receiving unit of the sensor chip is positioned in a projection area;
a lens cap including a cap body surrounding the sensor chip to hold the lens, and a cap edge part protruding outward from a lower end part of the cap body, the protruding cap edge part extending in a direction parallel to the upper surface of the substrate radially outward relative to the sensor chip; and
an ultraviolet-curing type bonding agent bonding the upper surface of the substrate and a lower surface of the lens cap including a lower surface of the cap edge part,
wherein a cutout is provided on an outer side surface of the cap edge part to expose a part of the substrate upper surface when viewed in a direction perpendicular to the upper surface of the substrate, and
the ultraviolet-curing type bonding agent protruded out of the lens cap enters the cutout.

2. The sensor module according to claim 1, further comprising a case provided inside the lens cap and vacuum-sealing the light receiving unit of the sensor chip, wherein an inside of the lens cap is not vacuum-sealed.

3. A sensor module comprising:
a substrate;
a sensor chip bonded or joined to an upper surface of the substrate;
a lens provided above the sensor chip such that a light receiving unit of the sensor chip is positioned in a projection area;
a lens cap including a cap body surrounding the sensor chip to hold the lens, and a cap edge part protruding outward from a lower end part of the cap body; and
an ultraviolet-curing type bonding agent bonding the upper surface of the substrate and a lower surface of the lens cap opposite to the upper surface of the substrate,
wherein a cutout is provided on an outer side surface of the cap edge part,
the ultraviolet-curing type bonding agent enters in the cutout, and
an inner surface of the cutout is tilted toward an inside of the lens cap from a lower surface to an upper surface of the cap edge part.

4. The sensor module according to claim 3, further comprising a case provided inside the lens cap and vacuum-sealing the light receiving unit of the sensor chip, wherein an inside of the lens cap is not vacuum-sealed.

* * * * *